US012282258B2

(12) United States Patent
Bettridge

(10) Patent No.: US 12,282,258 B2
(45) Date of Patent: Apr. 22, 2025

(54) BEAM GUIDE AND POSITIONING DEVICE FOR POSITIONING A SCRAPER MIRROR, PROVIDED FOR COUPLING OUT LASER RADIATION

(71) Applicant: TRUMPF Lasersystems for Semiconductor Manufacturing GmbH, Ditzingen (DE)

(72) Inventor: William Bettridge, Muehlacker (DE)

(73) Assignee: TRUMPF Lasersystems for Semiconductor Manufacturing GmbH, Ditzingen (DE)

( * ) Notice: Subject to any disclaimer, the term of this patent is extended or adjusted under 35 U.S.C. 154(b) by 918 days.

(21) Appl. No.: 17/401,752

(22) Filed: Aug. 13, 2021

(65) Prior Publication Data

US 2023/0047967 A1    Feb. 16, 2023

(51) Int. Cl.
*G03F 7/20*       (2006.01)
*G01B 11/27*   (2006.01)
*G02B 7/182*     (2021.01)
*H01S 3/086*    (2006.01)

(52) U.S. Cl.
CPC ............ *G03F 7/2008* (2013.01); *G01B 11/27* (2013.01); *G02B 7/1822* (2013.01); *G03F 7/2004* (2013.01); *H01S 3/086* (2013.01)

(58) Field of Classification Search
CPC ...... G03F 7/2008; G03F 7/2004; G01B 11/27; G02B 7/1822; G02B 19/0019; G02B 7/1815; H01S 3/086
See application file for complete search history.

(56) References Cited

U.S. PATENT DOCUMENTS 4,117,319 A       9/1978  White, III
2008/0291416 A1*  11/2008  Nishikawa .......... G03F 7/70833
                                                                355/55

* cited by examiner

*Primary Examiner* — Mesfin T Asfaw
(74) *Attorney, Agent, or Firm* — Laurence A. Greenberg; Werner H. Stemer; Ralph E. Locher

(57) ABSTRACT

A beam guide guides a laser beam on a device for extreme ultraviolet lithography. The beam guide has a scraper mirror for coupling out laser radiation and a positioning device for positioning the scraper mirror in a positioning plane defined by first and second positioning axes. The positioning device contains first and second positioning units assigned to the first and second positioning axes, respectively. The first positioning unit has a first linear guide and a first positioning drive. By the first positioning drive, the scraper mirror is moved together with the mirror-side guide element of the first linear guide relative to the mirror-remote guide element of the first linear guide along the first positioning axis into a target position. The second positioning unit has a second linear guide and a second positioning drive, the second linear guide has a mirror-side guide element and a mirror-remote guide element.

15 Claims, 6 Drawing Sheets

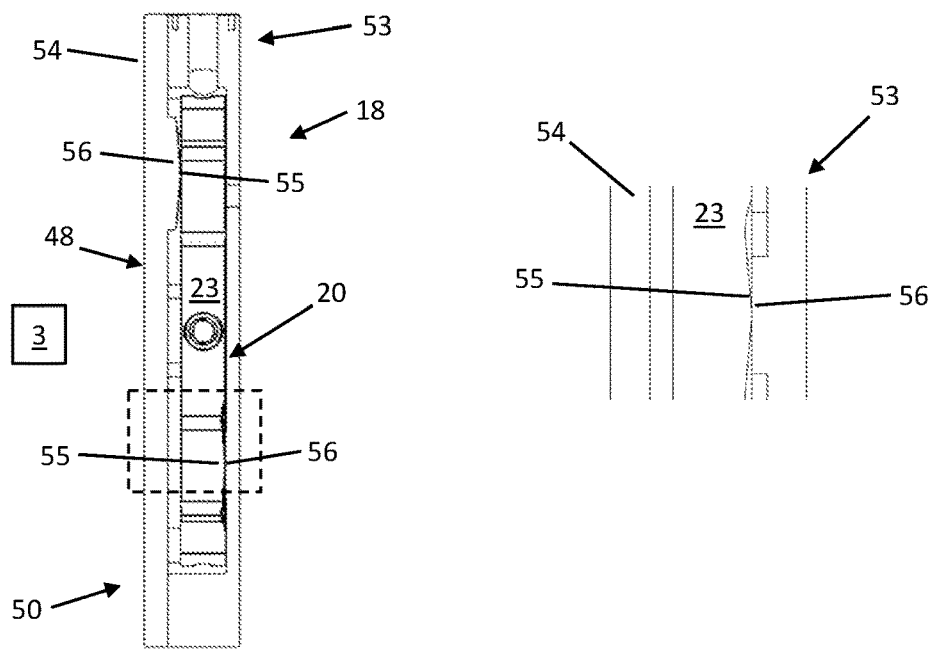
FIG. 9A
FIG. 9B
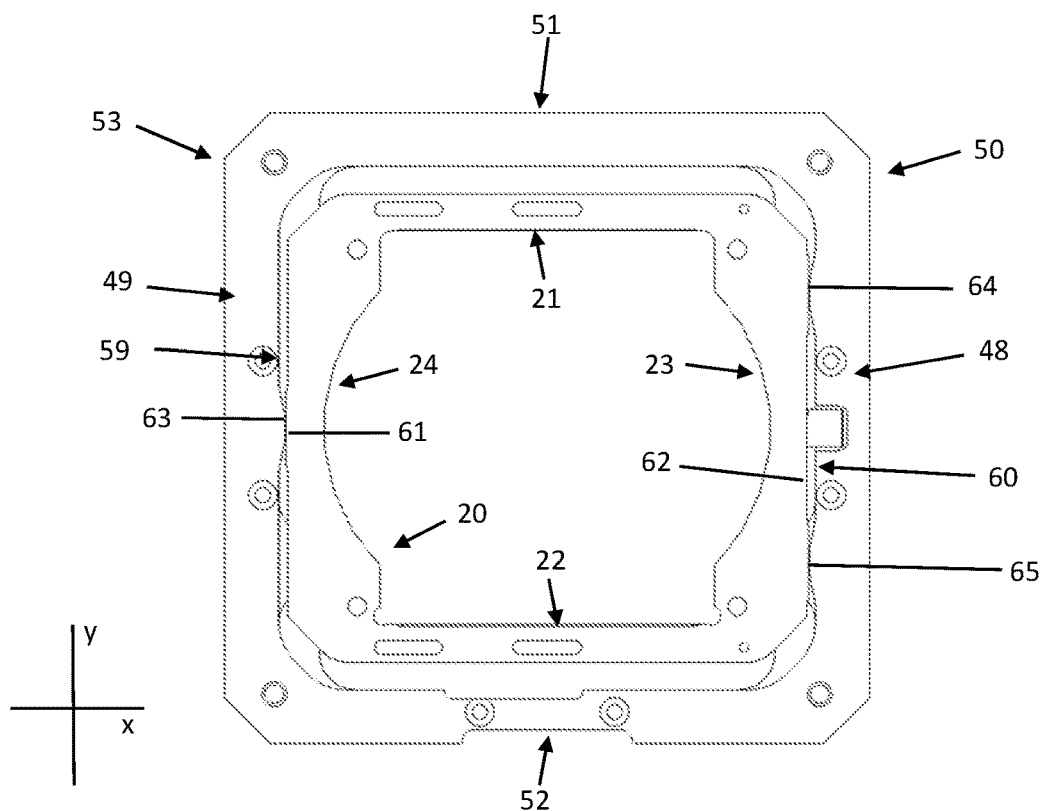
FIG. 10

BEAM GUIDE AND POSITIONING DEVICE FOR POSITIONING A SCRAPER MIRROR, PROVIDED FOR COUPLING OUT LASER RADIATION

BACKGROUND OF THE INVENTION

Field of the Invention

The invention relates to a positioning device for positioning a scraper mirror, provided for coupling out laser radiation, in a positioning plane which is defined by two positioning axes running perpendicular to each other.

The invention also relates to a beam guide on a device for EUV lithography, which beam guide is provided with such a positioning device.

Scraper mirrors are used, for example, on beam guides of devices for EUV lithography in order to couple out laser radiation from a laser beam which is fed to a droplet chamber of the device. Scraper mirrors are provided with an opening; the reflective surface of the scraper mirror is arranged on the edge of the opening. A portion of a laser beam arriving at the scraper mirror strikes the reflecting surface and is reflected by it at a defined angle. The rest of the laser beam passes through the opening of the scraper mirror.

To ensure optimal functionality of a scraper mirror, it is necessary to position the scraper mirror exactly in the beam path of the laser beam.

A positioning device for positioning a scraper mirror is disclosed in U.S. Pat. No. 4,117,319 A.

According to U.S. Pat. No. 4,117,319 A, a scraper mirror on a laser resonator is used to couple out the generated laser beam. To generate laser radiation, a concave resonator mirror is provided at one longitudinal end of the laser resonator, and a convex resonator mirror is provided at the other longitudinal end of the laser resonator. The scraper mirror is mounted on a mirror holder together with the convex resonator mirror. To position the convex resonator mirror relative to the concave resonator mirror and to adjust the direction of the laser beam coupled out by means of the scraper mirror, the mirror holder is adjusted by rotation about two mutually perpendicular axes.

BRIEF SUMMARY OF THE INVENTION

The object of the present invention is to provide a positioning device for a scraper mirror which enables the scraper mirror to be adjusted in a positioning plane.

According to the invention, this object is achieved by a positioning device that contains two positioning units, wherein a first of the positioning units enables the scraper mirror to be adjusted along a first positioning axis of the positioning plane, and wherein a second of the positioning units is provided for adjusting the scraper mirror along a second positioning axis of the positioning plane, which second axis extends perpendicular to the first positioning axis.

The first positioning unit contains a first linear guide and a first positioning drive. The first linear guide has a mirror-side guide element on the mirror side, which is connected to the scraper mirror, as well as a guide element which is remote from the mirror. On the mirror-remote guide element of the first linear guide, the scraper mirror is movably guided along the first positioning axis by means of the mirror-side guide element of the first linear guide. The first positioning drive is configured to move the scraper mirror, together with the mirror-side guide element of the first linear guide, in a guided manner along the first positioning axis relative to mirror-remote the guide element of the first linear guide, into a target position.

The second positioning unit assigned to the second positioning axis has a second linear guide and a second positioning drive. A mirror-side guide element of the second linear guide is connected to the mirror-remote guide element of the first linear guide and, together with the first linear guide and the scraper mirror, is movably guided along the second positioning axis on the mirror-remote guide element of the second linear guide. The second positioning drive is configured to move the first linear guide together with the mirror-side guide element of the second linear guide and the scraper mirror relative to the mirror-remote guide element of the second linear guide along the second positioning axis and into a target position.

In a preferred embodiment of the invention, the scraper mirror is provided with a mirror holder to which the mirror-side guide element or elements of the first linear guide are attached.

In the case of beam guide according to the invention, a beam absorber is preferably used as the mirror holder, on which beam absorber laser radiation is coupled out of an arriving laser beam by means of the scraper mirror and reflected toward the walls of the beam absorber.

A compact design of the positioning device is achieved in a further development of the invention by means of a guide frame which has four frame arms running perpendicular to each other. Two of the frame arms form frame arms of the first linear guide, and the other two frame arms form frame arms of the second linear guide. The frame arms of the first linear guide are provided as mirror-remote guide elements of the first linear guide, run along the first positioning axis, and are spaced apart from each other along the second positioning axis. The frame arms of the second linear guide form mirror-side guide elements of the second linear guide, run along the second positioning axis, and are spaced apart from each other along the first positioning axis. On each frame arm of the first linear guide, a mirror-side guide element of the first linear guide connected to the scraper mirror is movably guided together with the scraper mirror along the first positioning axis. Each frame arm of the second linear guide is movably guided along the second positioning axis jointly with the first linear guide and the scraper mirror on a mirror-remote guide element of the second linear guide. By means of the first positioning drive, the scraper mirror is adjusted together with the mirror-side guide elements of the first linear guide, relative to the frame arms of the first linear guide, along the first positioning axis. The second positioning drive moves the guide frame together with the mirror-side guide elements of the first linear guide and the scraper mirror along the second positioning axis into a target position.

Another embodiment of the positioning device according to the invention has a sliding guide as the first linear guide. At least one of the frame arms of the first linear guide is configured as a guiding frame arm by having two frame-side contact surfaces of the sliding guide which extend parallel to the positioning plane along the first positioning axis, and which are spaced apart from each other perpendicular to the positioning plane. The mirror-side guide element of the first linear guide assigned to the guiding frame arm of the first linear guide lies opposite each of the frame-side contact surfaces perpendicular to the positioning plane with a mirror-side contact surface of the sliding guide. The mirror-side contact surfaces of the sliding guide also extend parallel to the positioning plane along the first positioning axis. The frame-side and the mirror-side contact surfaces have the effect that the mirror-side guide element is supported without play on the associated frame arm of the first linear guide perpendicular to the positioning plane. In particular, it is provided that the mirror-side contact surfaces lie opposite frame-side contact surfaces, which frame-side contact surfaces are provided on outer sides of the guiding frame arm of the first linear guide, the outer sides of the guiding frame arm of the first linear guide facing away from each other.

If a mirror-side guide element is guided in this way on each of the frame arms of the first linear guide, the scraper mirror connected to the mirror-side guide elements is secured against undesired tilting movements relative to the guide frame about an axis that runs between the two guiding frame arms of the first linear guide along the first positioning axis.

Since the mirror-side contact surfaces on the mirror-side guide elements of the first linear guide have a sufficient extent along the first positioning axis, undesirable tilting movements of the scraper mirror connected to the mirror-side guide elements of the first linear guide, relative to the guide frame, about an axis that runs on the guide frame between the frame arms of the second linear guide, along the second positioning axis, are not possible.

A low-friction movement of the mirror-side guide elements of the first linear guide along the guiding frame arms of the first linear guide can be made possible by a corresponding material pairing. For example, the mirror-side guide elements of the first linear guide can be made of hardened steel, and the guiding frame arms of the first linear guide can be made of bronze. Additionally or alternatively, there is the possibility of applying a lubricant to the contact surfaces of the sliding guide that are in contact with each other.

According to the invention, it is possible to design the frame-side and/or the mirror-side contact surfaces of the sliding guide provided as the first linear guide as flat surfaces.

In a preferred embodiment of the invention, only one of the mutually associated contact surfaces is flat, while the other contact surface extends convexly relative to the flat contact surface. Due to the convex profile of one of the two contact surfaces, a linear contact results between the mutually associated contact surfaces in the ideal case. The curvature of the convex region of the given contact surface is selected in such a way that impressions caused by the mass of the scraper-mirror unit to be positioned, which would impair a functional sliding guide, are prevented on the associated flat contact surface.

In the case of a further embodiment of the positioning device according to the invention, the guide frame is used to generate a three-point support of the scraper mirror on the guide frame in the positioning plane. Support surfaces that interact with each other are provided on the inner side of the frame arms of the first linear guide provided on the guide frame and on the associated mirror-side guide elements of the first linear guide. This prevents undesired rotary movements of the scraper mirror relative to the guide frame about an axis which runs perpendicular to the positioning plane.

In a further embodiment of the invention, the mirror-side guide elements of the first linear guide designed as a sliding guide have a U-shaped cross section. On the arms of the U-shaped cross section, side walls are formed which are each provided with a mirror-side contact surface of the first linear guide. A base on the transverse web of the U-shaped cross section has the mirror-side support surface for three-point support of the scraper mirror on the guide frame.

In a further embodiment of the invention, the second linear guide of the positioning device is configured in accordance with the first linear guide.

In particular, a sliding guide is also provided as the second linear guide. At least one of the frame arms of the second linear guide is configured as a guided frame arm on the guide frame by having two frame-side contact surfaces of the sliding guide which extend parallel to the positioning plane along the second positioning axis, and which are spaced apart from each other perpendicular to the positioning plane. The mirror-remote guide elements of the second linear guide assigned to the guided frame arms of the second linear guide lie opposite the frame-side contact surfaces of the guided frame arms perpendicular to the positioning plane, each with a guide element-side contact surface of the sliding guide. The guide element-side contact surfaces of the sliding guide also extend parallel to the positioning plane along the second positioning axis. Due to their mutual association, the frame-side and the guide element-side contact surfaces ensure that the guide frame is supported on the mirror-remote guide elements of the second linear guide perpendicular to the positioning plane without play.

In a manner corresponding to the first linear guide, the guide frame is secured by means of the guided frame arms of the second linear guide on the mirror-remote guide elements of the second linear guide against undesired tilting movements relative to the mirror-remote guide elements of the second linear guide, about an axis that runs along the second positioning axis between the two guided frame arms of the second linear guide.

In addition, undesired tilting movements of the guide frame relative to the mirror-remote guide elements of the second linear guide about an axis that runs on the guide frame along the first positioning axis between the frame arms of the first linear guide are prevented.

A low-friction movement of the guide frame along the mirror-remote guide elements of the second linear guide can be made possible in a further embodiment of the invention by a corresponding material pairing. For example, the mirror-remote guide elements of the second linear guide can be made of hardened steel and the guided frame arms of the guide frame can be made of bronze. In addition or as an alternative, there is the possibility of applying a lubricant to the contact surfaces that are in contact with each other.

According to the invention, there is the possibility of configuring the frame-side and/or the guide element-side contact surfaces of the sliding guide provided as the second linear guide as flat surfaces.

In a preferred embodiment of the invention, only one of the mutually associated contact surfaces of the sliding guide provided as the second linear guide is flat, while the other contact surface extends convexly relative to the flat contact surface. Due to the convex profile of one of the two contact surfaces, a linear contact results between the mutually associated contact surfaces in the ideal case. The curvature of the convex region of the given contact surface is selected in such a way that impressions caused by the mass of the guide frame and the scraper-mirror unit on the associated flat contact surface, which would impair a functional sliding guide of the guide frame, are prevented.

In a further embodiment of the positioning device according to the invention, the mirror-remote guide elements of the second linear guide are used to produce a three-point support of the guide frame provided with the scraper mirror on the mirror-remote guide elements of the second linear guide in the positioning plane. On the inside of the mirror-remote guide elements of the second linear guide and on the assigned guided frame arms of the guide frame, corresponding support surfaces that interact with each other are provided. This prevents undesired rotational movements of the guide frame relative to the mirror-remote guide elements of the second linear guide about an axis that runs perpendicular to the positioning plane.

In a further embodiment of the invention, the first positioning drive of the positioning device is configured as a first threaded positioning drive. An adjusting screw of the first threaded positioning drive contains a screw bolt, the thread axis of which runs along the first positioning axis. The adjusting screw of the first threaded positioning drive meshes, with the external thread on the screw bolt, with an internal thread on the guide frame. The thread axis of the internal thread on the guide frame also runs along the first positioning axis. By turning the adjusting screw around the threaded axis of the screw bolt, the adjusting screw is moved along the first positioning axis. The adjusting screw carries the scraper mirror with it in its direction of movement. As a result, the scraper mirror is advanced into a target position relative to the guide frame along the first positioning axis. During its adjustment movement, the scraper mirror is guided on the guiding frame arms of the guide frame by means of the mirror-side guide elements of the first linear guide.

In an advantageous embodiment of the invention, the scraper mirror is accommodated in the interior of the guide frame. In this case, the extension of the frame arms of the first linear guide along the first positioning axis exceeds the corresponding extension of the scraper mirror unit at least by the length of the adjustment path of the scraper mirror unit along the first positioning axis.

In order to connect to the screw bolt of the adjusting screw of the first threaded positioning drive, the scraper mirror is supported on the screw bolt in a further development of the invention by means of at least one preloaded spring element.

In the case of a further embodiment of the invention, the guide frame having the frame arms of the first linear guide and the frame arms of the second linear guide is provided as an inner guide frame, and is arranged inside an outer guide frame. The outer guide frame has four frame arms running perpendicular to each other. Two of the frame arms of the outer guide frame run along the second positioning axis and are spaced apart from each other along the first positioning axis. The frame arms of the outer guide frame, which run along the second positioning axis, form guiding frame arms of the outer guide frame. They guide the inner guide frame on the frame arms of the inner guide frame, which are provided as mirror-side guide elements of the second linear guide, along the second positioning axis. The extension of the guiding frame arms of the outer guide frame along the second positioning axis is greater than the extension of the inner guide frame along the second positioning axis, at least by the length of the adjustment path of the inner guide frame.

The two remaining frame arms of the outer guide frame connect the guiding frame arms of the outer guide frame and run perpendicular to the guiding frame arms of the outer guide frame along the first positioning axis.

In a preferred embodiment of the invention, the positioning device is connected to further components of the beam guide provided with the positioning device, on the outer guide frame.

In a further embodiment of the invention, the outer guide frame is divided parallel to the positioning plane of the scraper mirror, forming two interconnected outer frame parts.

The inner guide frame is guided with the frame arms of the second linear guide on the inner sides of the outer frame parts along the second positioning axis. The frame-side contact surfaces on the guided frame arms of the inner guide frame form, with guide element-side contact surfaces on the inner sides of the outer frame parts, the sliding guide provided as a second linear guide for the inner guide frame and the scraper mirror provided thereon.

To assemble the inner guide frame, the outer frame parts are separated from each other so that the inner guide frame can be inserted between the two outer frame parts of the outer guide frame.

In the case of a further embodiment of the invention, the second positioning drive for adjusting the inner guide frame relative to the outer guide frame is configured as a second threaded positioning drive. The second threaded positioning drive comprises an adjusting screw with a screw bolt, the external thread of which runs with a thread axis along the second positioning axis. On its external thread, the screw bolt of the adjusting screw of the second positioning drive meshes with a coaxial internal thread on the outer guide frame. By turning the adjusting screw around the thread axis of the screw bolt, the inner guide frame supported on the screw bolt is moved along the second positioning axis, and the scraper mirror mounted on the inner guide frame is thereby guided along the second positioning axis into a target position.

Other features which are considered as characteristic for the invention are set forth in the appended claims.

Although the invention is illustrated and described herein as embodied in a positioning device for positioning a scraper mirror, provided for coupling out laser radiation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 9A is a view of the inner guide frame guided on the outer guide frame, in a view in the direction of the arrow IX in FIG. 7;

FIG. 9B is a view of the region framed by dashed lines in FIG. 9A, at an enlarged scale; and FIG. 10 is an elevational view of the arrangement according to FIG. 7, in a view into the interior of the outer guide frame.

DETAILED DESCRIPTION OF THE INVENTION

Figure 1:
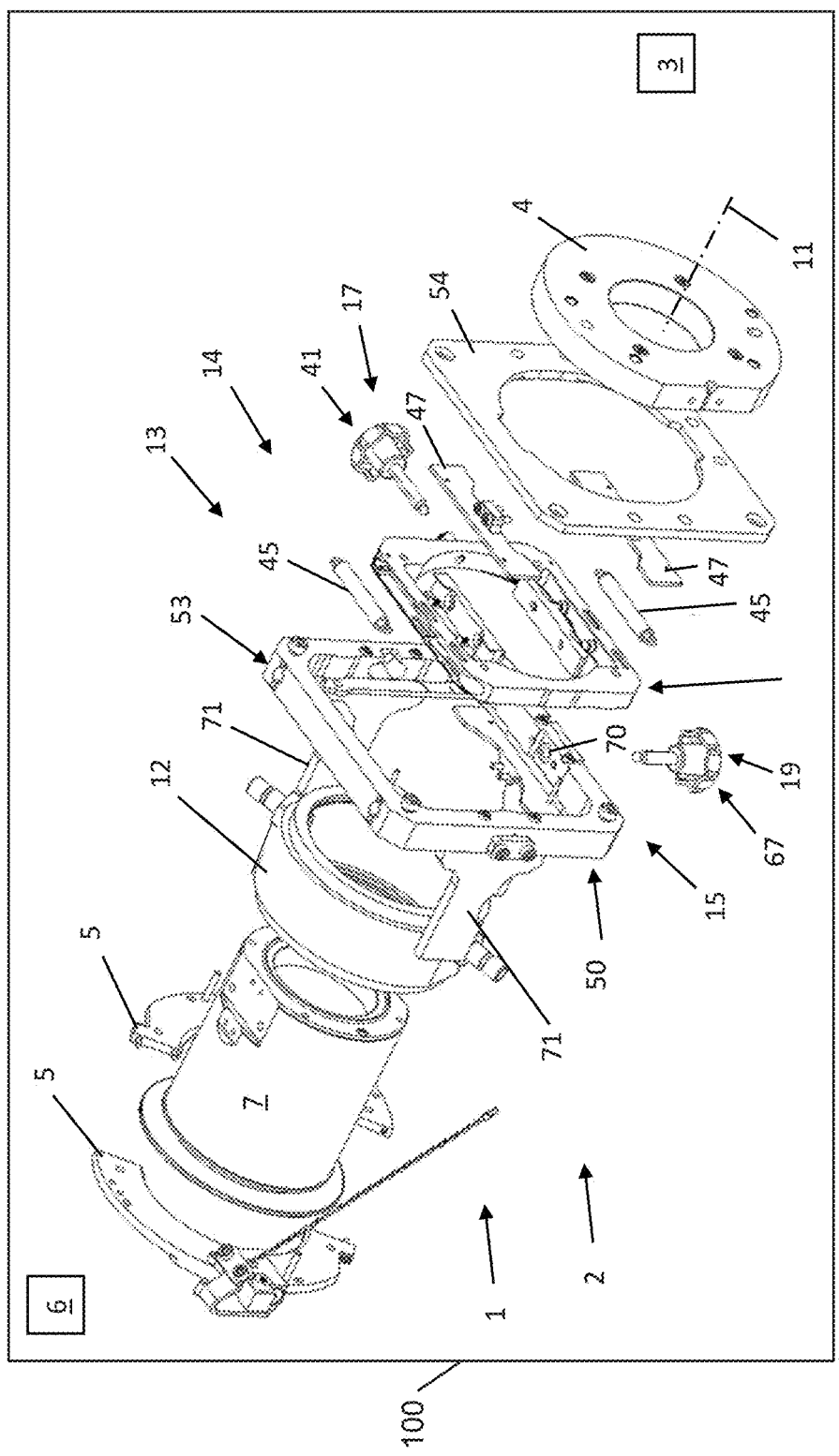
FIG. 1 is an exploded, perspective view of a beam guide for guiding a laser beam on a device for EUV lithography, with an absorber unit containing an absorber and a positioning device for positioning a scraper mirror.
Figure 2:
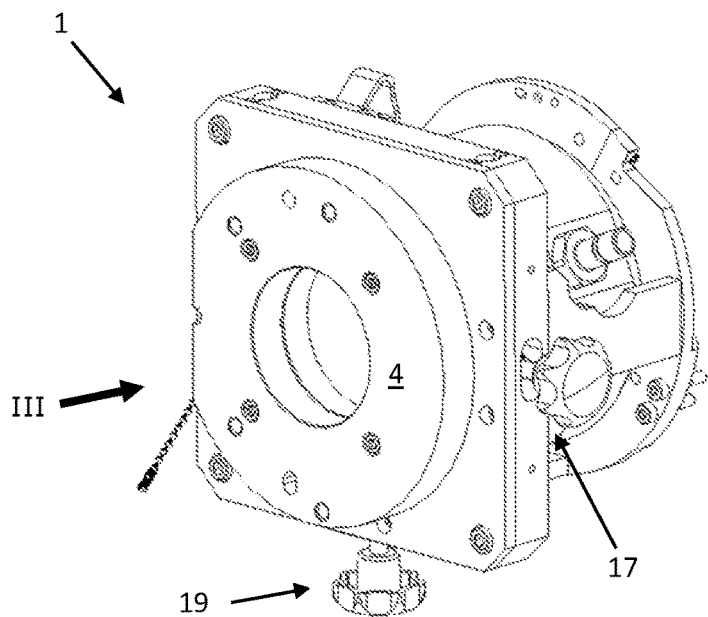
FIG. 2 is a perspective view of the absorber unit according to FIG. 1 in the assembled state.
Figure 3:
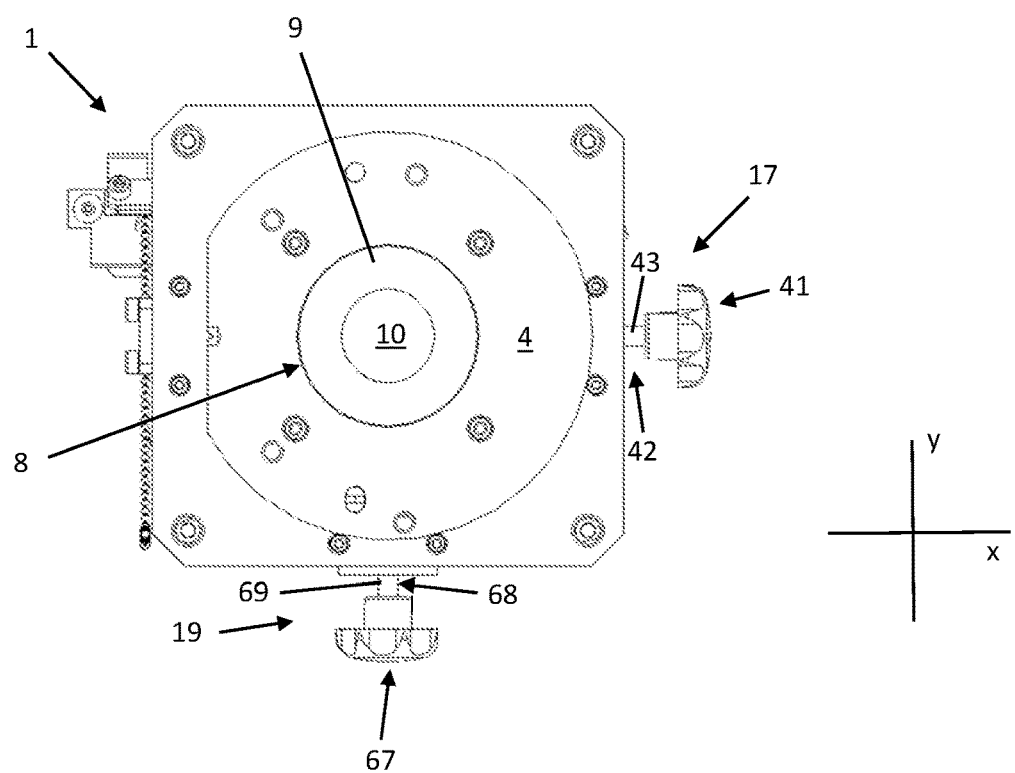
FIG. 3 is an elevational view of the absorber unit according to FIG. 2 in the view in the direction of the arrow III shown in FIG. 2.

Referring now to the figures of the drawings in detail and first, particularly to FIG. 1 thereof, there is shown an absorber unit 1 in an exploded view and in the assembled state in FIGS. 2 and 3, forms part of a beam guide 2 for guiding a laser beam on a device for EUV lithography 100. By means of the beam guide 2, a laser beam is directed from a beam source, not shown, to a droplet chamber, likewise not shown, of the device for EUV lithography 100.

The absorber unit 1 is attached on the one hand to a beam guide tube 3 of the beam guide 2, which is indicated very schematically in FIG. 1. The connection between the beam guide tube 3 and the absorber unit 1 is produced on an adapter flange 4 of the absorber unit 1. At the opposite end, the absorber unit 1 is mounted by means of a two-part clamping ring 5 on a housing 6, which is also shown only very schematically in FIG. 1, of a further construction unit of the beam guide 2.

The absorber unit 1 contains a tubular absorber 7 which, when the absorber unit 1 is assembled, is screwed to the adapter flange 4 and is thereby connected to the beam guide tube 3. A scraper mirror 8, which can be seen in FIG. 3, is mounted in the interior of the absorber 7. The absorber 7 accordingly forms a mirror support for the scraper mirror 8.

The scraper mirror 8 is of conventional design and has a reflecting surface 9 which surrounds a mirror opening 10.

By means of the scraper mirror 8, laser radiation is coupled out from a laser beam which arrives at the scraper mirror 8 along a beam axis 11 shown in FIG. 1. The coupled-out laser radiation is reflected on the reflective surface 9 of the scraper mirror 8 toward the inner side of the wall of the absorber 7. To cool the wall of the absorber 7, a cooling ring 12 is seated on its outside. Cooling liquid flows through the cooling ring 12.

So that the scraper mirror 8 can optimally fulfill its intended function, it is positioned relative to the incoming laser beam in a positioning plane that is defined by a first positioning axis (x-axis) and a second positioning axis (y-axis) running perpendicular thereto (FIG. 3). An adjustment of the laser beam relative to the scraper mirror 8 is not provided for in the example shown.

A positioning device 13 provided for positioning the scraper mirror 8 contains a first positioning unit 14 and a second positioning unit 15. The first positioning unit 14 is assigned to the x-axis of the positioning plane; the scraper mirror 8 can be adjusted along the y-axis by means of the second positioning unit 15.

The first positioning unit 14 contains a first linear guide 16 and a first positioning drive 17. The second positioning unit 15 accordingly has a second linear guide 18 and a second positioning drive 19.

An inner guide frame 20 is both part of the first linear guide 16 and part of the second linear guide 18.

Figure 5:
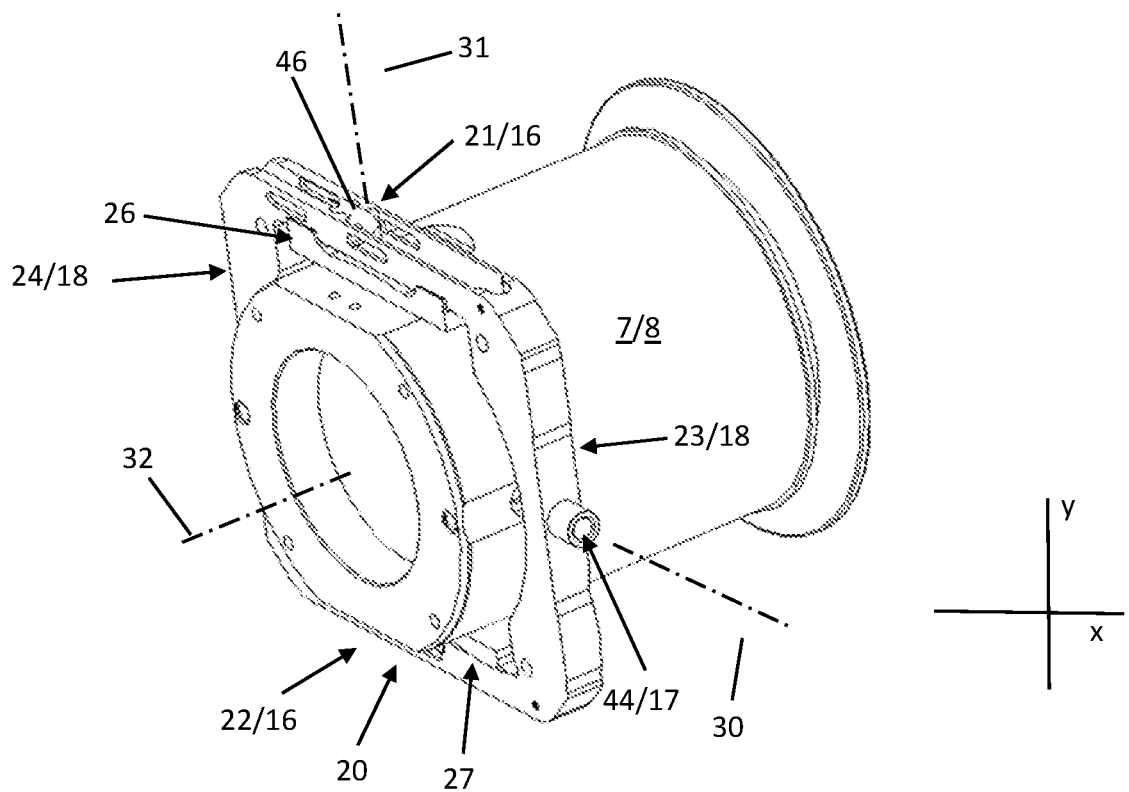
FIG. 5 is a perspective view of the absorber according to FIG. 1 on an inner guide frame of the positioning device for positioning the scraper mirror.

According to FIG. 5, the inner guide frame 20 has two frame arms 21, 22 of the first linear guide 16 and two frame arms 23, 24 of the second linear guide 18. The frame arms 21, 22 of the first linear guide 16 run along the x-axis and are spaced apart from each other along the y-axis of the positioning plane. The frame arms 23, 24 of the second linear guide 18 run along the y-axis and are spaced apart from each other along the x-axis.

Both the first linear guide 16 and the second linear guide 18 are sliding guides.

The frame arms 21, 22 of the first linear guide 16 provided on the inner guide frame 20 are configured as guiding frame arms.

Figure 6:
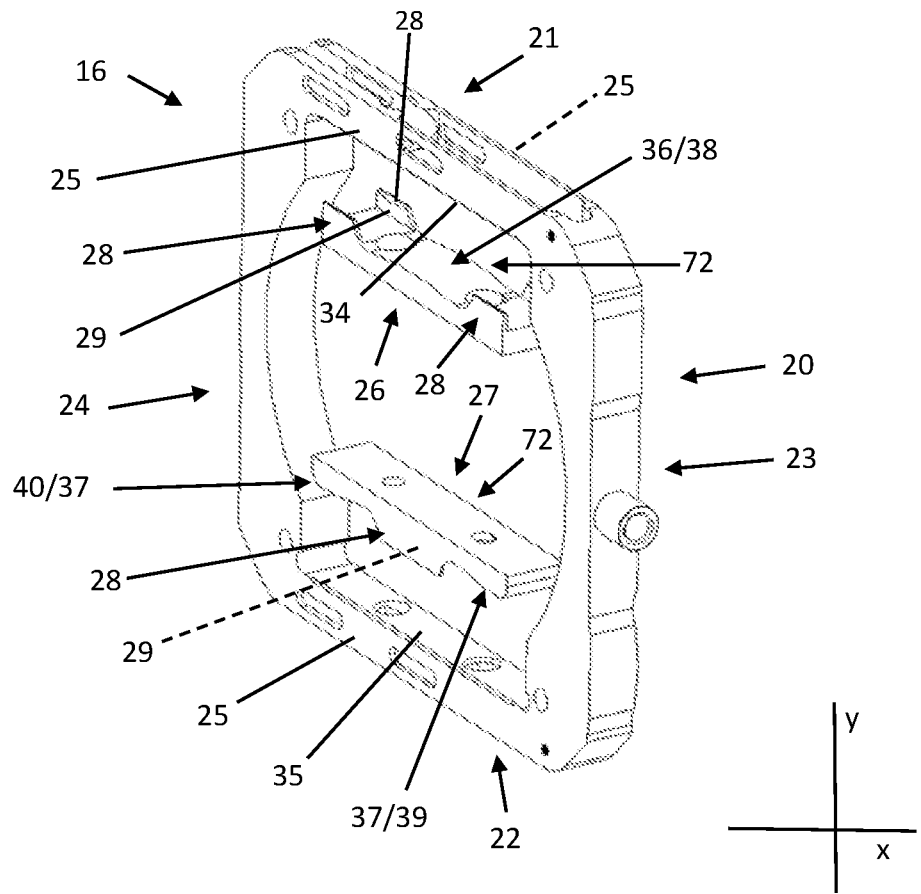
FIG. 6 is a perspective view of the inner guide frame according to FIG. 5 with mirror-side guide elements of a first linear guide for the scraper mirror.

According to FIG. 6, the frame arms 21, 22 each have a frame-side contact surface 25 of the first linear guide 16 configured as a sliding guide on their outer sides pointing away from each other. The frame-side contact surfaces 25 on each of the frame arms 21, 22 extend parallel to the positioning plane along the x-axis and are spaced apart from each other perpendicular to the positioning plane.

An upper guide shoe 26 and a lower guide shoe 27 are seated on the frame arms 21, 22 as mirror-side guide elements. Both guide shoes 26, 27 are screwed to the absorber 7 and have a substantially U-shaped cross section.

On the arms of the U-shaped cross section, both on the upper guide shoe 26 and on the lower guide shoe 27, side walls 28 are formed, which run along the x-axis and which are provided on their side facing the frame arms 21, 22 with a mirror-side contact surface 29 of the first linear guide 16 formed as a sliding guide. With its mirror-side contact surfaces 29, the upper guide shoe 26 lies opposite the frame-side contact surfaces 25 on the frame arm 21 of the inner guide frame 20. The lower guide shoe 27 is positioned in the same way, with its mirror-side contact surfaces 29 opposite the frame-side contact surfaces 25 of the frame arm 22. In this way, the upper guide shoe 26 and the lower guide shoe 27, including the absorber 7 screwed to the guide shoes 26, 27 and including the scraper mirror 8 housed inside the absorber 7, are mounted on the inner guide frame 20 without play perpendicular to the positioning plane, specifically on the frame arms 21, 22 of the inner guide frame 20.

Due to the close mutual contact of the frame-side contact surfaces 25 of the frame arms 21, 22 on the one hand, and the mirror-side contact surfaces 29 on the guide shoes 26, 27 one other hand, the scraper mirror 8 is additionally secured on the frame arms 21, 22 of the inner guide frame 20 via the absorber 7 and the guide shoes 26, 27 against undesired tilting movements relative to the inner guide frame 20 about an axis 30 which runs on the inner guide frame 20 between the frame arms 21, 22 along the x-axis (FIG. 5).

In addition, the interaction of the frame-side contact surfaces 25 of the frame arms 21, 22 on the one hand, and the mirror-side contact surfaces 29 on the guide shoes 26, 27 on the other hand prevents undesired tilting movements of the scraper mirror 8 relative to the inner guide frame 20 about an axis 31, which runs along the y-axis (FIG. 5) on the inner guide frame 20 between the frame arms 23, 24.

The effective support of the scraper mirror 8 about the axis 31 on the inner guide frame 20 is produced in particular by means of the upper guide shoe 26. For this purpose, the upper guide shoe 26 has two mirror-side contact surfaces 29 on each side of the frame arm 21, which are offset from each other along the x-axis.

In the example shown, the frame-side contact surfaces 25 on the frame arms 21, 22 of the inner guide frame 20 are configured as flat surfaces, while the mirror-side contact surfaces 29 on the guide shoes 26, 27 are convex relative to the frame-side contact surfaces 25. As a result, there is substantially linear contact between the frame arms 21, 22 of the inner guide frame 20 on the one hand and the guide shoes 26, 27 on the other hand on the contact surfaces 25, 29. The curvature of the convex, mirror-side contact surfaces 29 is selected in such a way that no impressions caused by the mass of the absorber 7, and no impressions caused by the mass of the beam guide tube 3 connected to the absorber 7 via the adapter flange 4, are produced on the frame-side contact surfaces 25. Such impressions on the frame-side contact surfaces 25 would impair the positioning of the scraper mirror 8 along the x-axis.

Finally, the scraper mirror 8 is secured by means of the guide shoes 26, 27 and the frame arms 21, 22 of the inner guide frame 20 against rotation relative to the inner guide frame 20 about an axis 32 which runs perpendicular to the positioning plane (FIG. 5).

For this purpose, a three-point support of the absorber 7, which is effective in the positioning plane, is provided on the inner sides of the frame arms 21, 22 facing the interior of the inner guide frame 20.

The three-point support of the absorber 7 on the inner guide frame 20 is achieved by means of a first frame-side support surface 34 provided on the inner side of the frame arm 21 and configured as a flat surface, a second frame-side support surface 35 provided on the inner side of the frame arm 22, a first mirror-side support surface 36 on the upper guide shoe 26, and a second mirror-side support surface 37 on the lower guide shoe 27. The mirror-side support surfaces 36, 37 are provided on a base 72 of the guide shoes 26, 27. The base 72 is formed on a transverse web of the U-shaped cross section of the guide shoes 26, 27 (FIG. 6).

The first frame-side support surface 34 and the second frame-side support surface 35 extend as flat surfaces along the x-axis. The first mirror-side support surface 36 extends convexly parallel to the positioning plane relative to the first frame-side support surface 34 at a point 38. The second mirror-side support surface 37 has a convex profile parallel to the positioning plane at two points 39, 40 offset from each other along the x-axis.

For the three-point support of the absorber 7 and the scraper mirror 8 against a rotational movement about the axis 32 relative to the inner guide frame 20, the upper guide shoe 26 and the lower guide shoe 27 are supported with the points 38, 39, 40 of the first mirror-side support surface 36 and the second mirror-side support surface 37 on the first frame-side support surface 34 and on the second frame-side support surface 35 of the frame arms 21, 22 of the inner guide frame 20.

To position the scraper mirror 8 along the x-axis, the absorber 7, together with the guide shoes 26, 27 attached to it, is moved along the x-axis by means of the first positioning drive 17. Movements of the absorber 7 along the x-axis are executed in tandem by the parts of the beam guide 2—for example, the beam guide tube 3—which are connected to the absorber 7.

The first positioning drive 17 contains an adjusting screw 41 with a screw bolt 42 which meshes on an external thread 43 with an internal thread 44 which is arranged on the inner guide frame 20 (FIGS. 3 and 5). The congruent thread axes of the external thread 43 on the screw bolt 42 and of the internal thread 44 on the inner guide frame 20 run along the x-axis.

The screw bolt 42 of the adjusting screw 41 is supported on the absorber 7 at its free end. By turning the adjusting screw 41, the screw bolt 42 is moved relative to the inner guide frame 20 along the x-axis. So that a movement of the absorber 7 along the x-axis can be generated in both directions by turning the adjusting screw 41, the absorber 7 is pressed by two preloaded spring elements 45 (FIG. 1) along the x-axis against the free end of the screw bolt 42 of the adjusting screw 41.

The spring elements 45 shown in FIG. 1 are inserted into corresponding grooves 46 on the upper side of the frame arm 21 and on the lower side of the frame arm 22 of the inner guide frame 20. The groove 46 on the frame arm 21 is shown in FIG. 5. The groove 46 on the frame arm 22 is configured accordingly.

In each case, one longitudinal end of the spring elements 45 is fixed on a spring abutment 47 (FIG. 1), which in turn is screwed to the absorber 7. Each of the opposite longitudinal ends of the spring elements 45 is fastened to the inner guide frame 20. If the absorber 7 is adjusted in FIG. 3 to the left by means of the first positioning drive 17 along the x-axis relative to the inner guide frame 20, the spring elements 45 are pretensioned.

During a subsequent adjustment movement of the absorber 7 in the opposite direction, the tensile force exerted by the preloaded spring elements 45 acts on the absorber 7 as a restoring force.

To adjust the scraper mirror 8 along the y-axis, the inner guide frame 20 is movably guided with the frame arms 23, 24 along the y-axis on frame arms 48, 49 of an outer guide frame 50, the second linear guide 18 thus being formed (FIG. 7 to 9B). The frame arms 48, 49 of the outer guide frame 50 form mirror-remote guide elements of the second linear guide 18, run along the y-axis, and are spaced apart from each other along the x-axis. The frame arms 23, 24 of the inner guide frame 20 form mirror-side guide elements of the second linear guide 18.

The frame arms 23, 24 of the inner guide frame 20 are provided as guided frame arms of the second linear guide 18, while the frame arms 48, 49 of the outer guide frame 50 form guiding frame arms of the second linear guide 18.

Two further frame arms 51, 52 of the outer guide frame 20 are provided as connecting frame arms, run along the x-axis and have a mutual spacing along the y-axis that is greater than the extent of the inner guide frame 20 along the y-axis.

Figure 7:
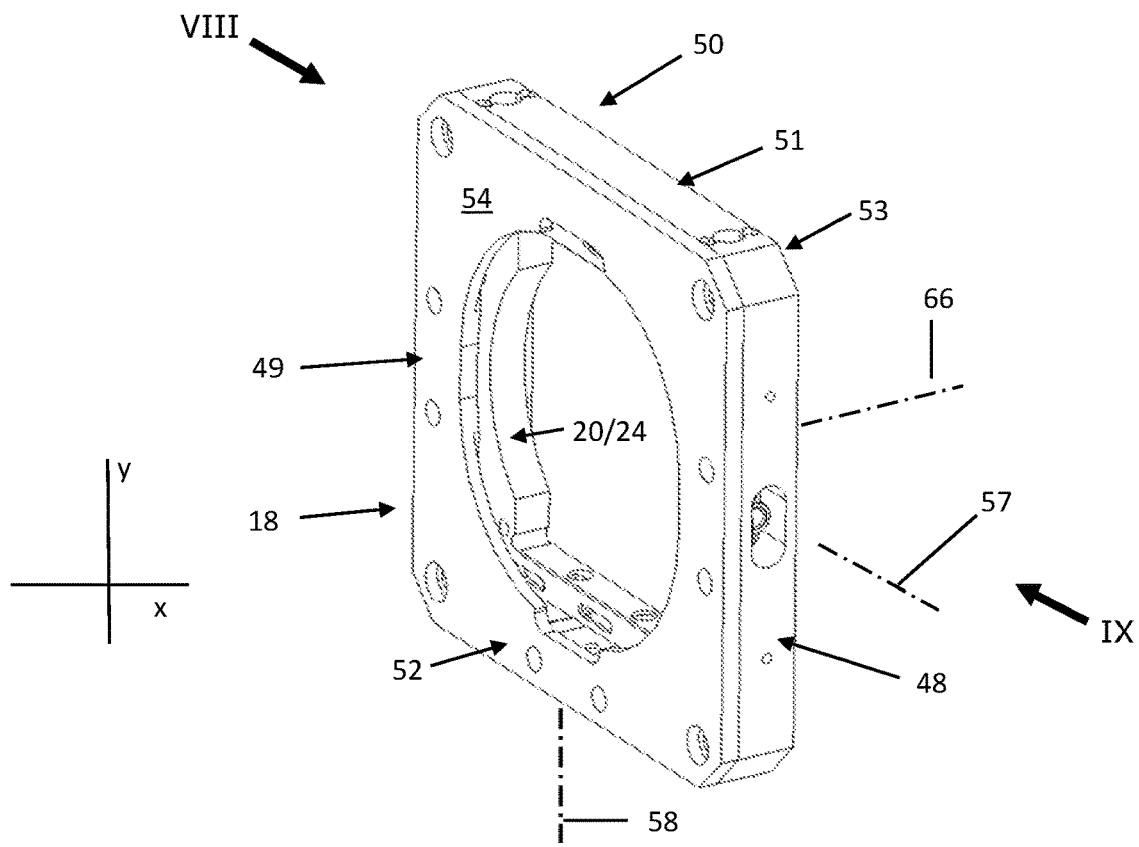
FIG. 7 is a perspective view of the inner guide frame according to FIGS. 5 and 6 on an outer guide frame of the positioning device for positioning the scraper mirror.

As can be seen, for example, from FIG. 7, the outer guide frame 50 is divided parallel to the positioning plane. A frame base body 53 and a frame cover 54 screwed to it are provided as outer frame parts.

The second linear guide 18 is also configured as a sliding guide. Details of the second linear guide 18 are shown in FIGS. 8A to 9B, wherein FIGS. 8B and 9B show the regions enclosed in dashed in lines in FIGS. 8A and 9A in a highly enlarged view.

On the frame arms 23, 24 of the inner guide frame 20, frame-side contact surfaces 55 are provided on the sides of the frame arms 23, 24 facing away from each other. Each of the frame-side contact surfaces 55 on the inner guide frame 20 is assigned a guide element-side contact surface 56 on the outer guide frame 50. The guide element-side contact surfaces 56 are each provided on the frame base body 53 and on the frame cover 54 of the outer guide frame 50.

The contact between the frame base body 53 of the outer guide frame 50 and the frame arms 23, 24 of the inner guide frame 20 is established between flat guide-side contact surfaces 56 on the frame base body 53 and, in each case, a convex frame-side contact surface 55 on the frame arms 23, 24 of the inner guide frame 20. The frame cover 54 of the outer guide frame 50 and the frame arms 23, 24 of the inner guide frame 20 are in contact with each other at convex guide element-side contact surfaces 56 on the frame cover 54 on the one hand, and flat frame-side contact surfaces 55 on the frame arms 23, 24 on the other hand.

Figures 8A, 8B:
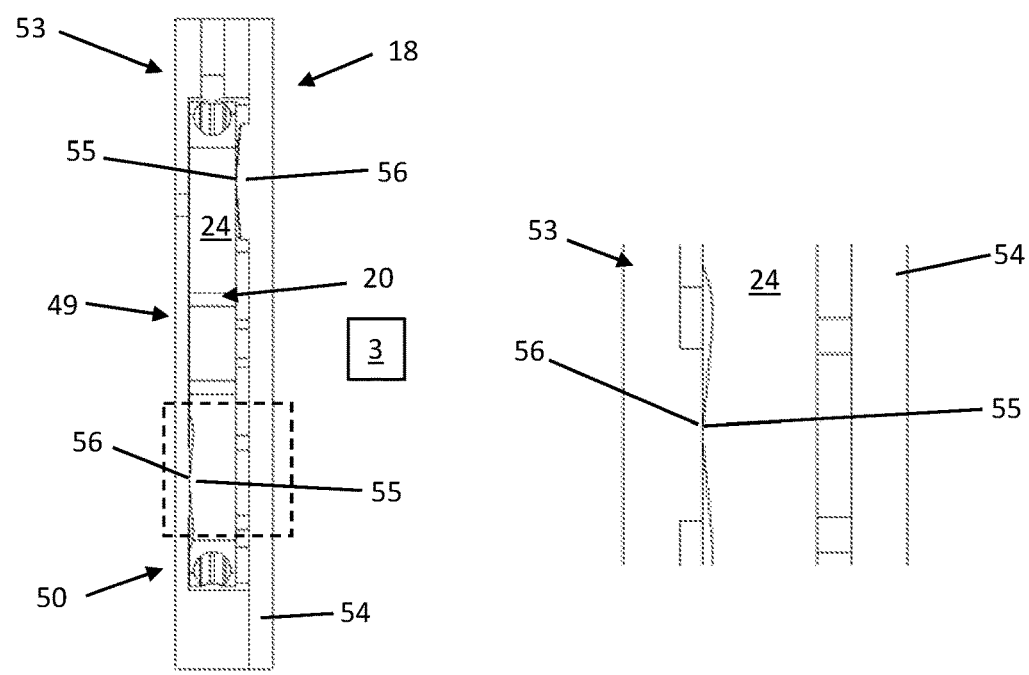
FIG. 8A is a view of the inner guide frame guided on the outer guide frame, in a view in the direction of arrow VIII in FIG. 7.
FIG. 8B is a view of the region framed by dashed lines in FIG. 8A, at an enlarged scale.

The beam guide tube 3 is indicated in FIGS. 8A and 9A. The beam guide tube 3 is connected to the absorber 7. The weight of the beam guide tube 3 is therefore carried by the inner guide frame 20 via the guide shoe 26, 27 screwed to the absorber 7. As a result, the inner guide frame 20 is, due to the weight of the beam guide tube 3, exclusively supported with the flat frame-side contact surfaces 55 on the convex guide element-side contact surfaces 56 of the frame cover 54, and with the convex frame-side contact surfaces 55 on the flat guide element-side contact surfaces 56 of the frame base body 53.

Except in FIGS. 8A to 9B, the convex regions of the frame-side contact surfaces 55 on the frame arms 23, 24 of the inner guide frame 20 are not shown, for the sake of simplicity.

Due to the interaction of the frame-side contact surfaces 55 and the guide element-side contact surfaces 56, the inner guide frame 20 is guided with the frame arms 23, 24 on the frame arms 48, 49 of the outer guide frame 50, without play, perpendicular to the positioning plane, and is also secured against tilting movements about axes 57, 58 (FIG. 7). Due to the mounting of the absorber 7 on the inner guide frame 20, the same applies to the scraper mirror 8.

According to FIG. 10, it is also provided a three-point support of the inner guide frame 20 on the outer guide frame 50 in the positioning plane. In FIG. 10, the frame cover 54 is removed from the frame base body 53 on the outer guide frame 50.

A first guide element-side support surface 59 is provided on the inner side of the part of the frame arm 49 of the outer guide frame 50 formed on the frame base body 53. The part of the frame arm 48 of the outer guide frame 50 formed on the frame base body 53 has, on its inner side, a second guide element-side support surface 60. A first frame-side support surface 61 on the frame arm 24 of the inner guide frame 20 is assigned to the first guide element-side support surface 59 on the frame arm 49 of the outer guide frame 50. A second frame-side support surface 62 on the frame arm 23 of the inner guide frame 20 is in contact with the second guide element-side support surface 60 on the frame arm 48 of the outer guide frame 50.

The three-point support of the inner guide frame 20 on the outer guide frame 50 takes place at a convex point 63 of the first guide element-side support surface 59 and at two convex points 64, 65 of the second guide element-side support surface 60 spaced from each other along the y-axis. At the convex points 63, 64, 65 of the outer guide frame 50, the frame arms 23, 24 of the inner guide frame 20 are supported with the flat frame-side support surfaces 61, 62.

As a result of the three-point support of the inner guide frame 20 on the outer guide frame 50, rotational movements of the inner guide frame 20 relative to the outer guide frame 50 about an axis 66 running perpendicular to the positioning plane are not possible (FIG. 7). As a result of the three-point support of the absorber 7 on the inner guide frame 20, the scraper mirror 8 is thus also supported on the outer guide frame 50 against a rotational movement relative to the outer guide frame 50 about the axis 66.

The joint positioning of the inner guide frame 20 and the scraper mirror 8 along the y-axis relative to the outer guide frame 50 takes place by means of the second positioning drive 19 (FIG. 3).

Like the first positioning drive 17, the second positioning drive 19 is also designed as a threaded positioning drive.

The second positioning drive 19 contains an adjusting screw 67 with a screw bolt 68 which meshes on an external thread 69 with a coaxial internal thread 70 (FIG. 1) on the frame arm 52 of the outer guide frame 50.

By turning the adjusting screw 67 about the thread axis of the screw bolt 68, the screw bolt 68 of the adjusting screw 67 is moved relative to the outer guide frame 50 along the y-axis. Depending on the direction of rotation of the adjusting screw 67, the inner guide frame 20 is raised or lowered together with the absorber 7 and the scraper mirror 8 relative to the outer guide frame 50 along the y-axis. Under the action of gravity, the inner guide frame 20 is supported on the free end of the screw bolt 68 of the adjusting screw 67. Due to the force of gravity, the inner guide frame 20, together with the absorber 7 guided on it, automatically follows the adjusting screw 67 during downward movements along the y-axis.

Figure 4:
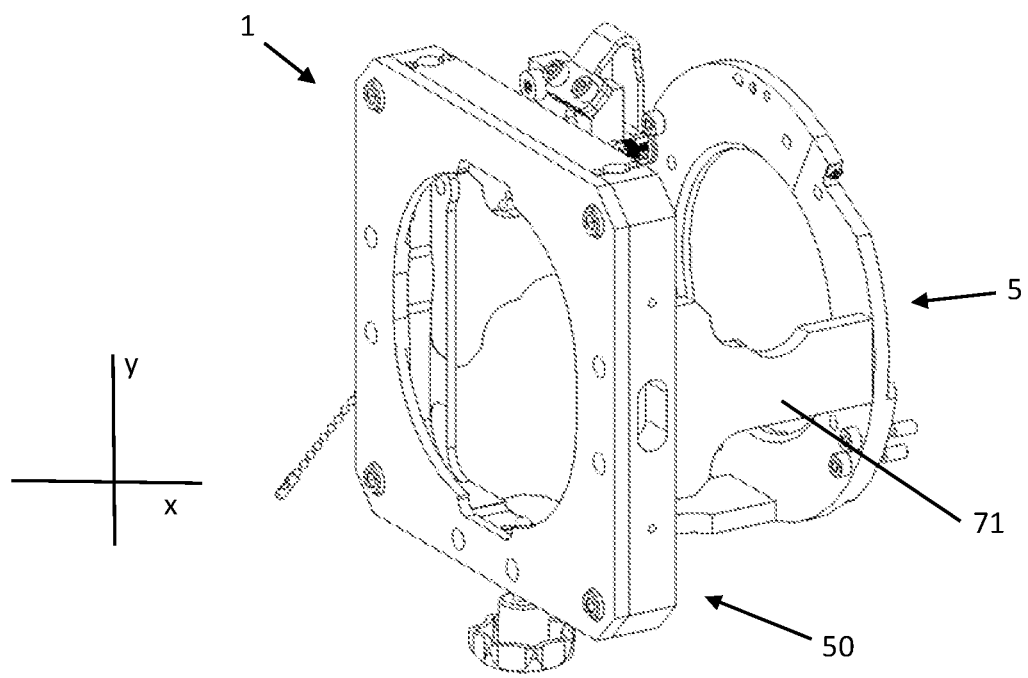
FIG. 4 is a perspective view of the part of the absorber unit according to FIG. 1 to 3 that is stationary when the scraper mirror is positioned.

In the manner described, the scraper mirror 8 can be positioned in the positioning plane defined by the x-axis and the y-axis relative to the part of the absorber unit 1 shown in FIG. 4. The part of the absorber unit 1 shown in FIG. 4 substantially contains the outer guide frame 50, the clamping ring 5, and spacers 71 via which the outer guide frame 50 is connected to the clamping ring 5.

During the positioning of the scraper mirror 8, the absorber 7 provided with the scraper mirror 8 moves on the one hand relative to the stationary outer guide frame 50, and on the other hand relative to the housing 6 of the beam guide 2. The connection of the absorber 7 to the housing 6 produced by means of the clamping ring 5 allows such a relative movement.

The invention claimed is:

1. A positioning device for positioning a scraper mirror, provided for coupling out laser radiation, in a positioning plane being defined by a first positioning axis and a second positioning axis, wherein the first positioning axis and the second positioning axis running perpendicular to each other, the positioning device comprising:

two positioning units including a first positioning unit assigned to the first positioning axis and a second positioning unit assigned to said second positioning axis, said first positioning unit having a first linear guide and a first positioning drive, wherein said first linear guide having a mirror-side guide element and a mirror-remote guide element, wherein said mirror-side guide element of said first linear guide being connected to the scraper mirror and jointly guided with the scraper mirror on said mirror-remote guide element of said first linear guide along the first positioning axis, and wherein by means of said first positioning drive, the scraper mirror can be moved together with said mirror-side guide element of said first linear guide relative to said mirror-remote guide element of said first linear guide along the first positioning axis into a target position;

said second positioning unit containing a second linear guide and a second positioning drive, wherein said second linear guide having a mirror-side guide element and a mirror-remote guide element, wherein said mirror-side guide element of said second linear guide being connected to said mirror-remote guide element of said first linear guide, and is movably guided along the second positioning axis jointly with said first linear guide and the scraper mirror on said mirror-remote guide element of said second linear guide, and wherein by means of said second positioning drive, said first linear guide can be moved together with said mirror-side guide element of said second linear guide and the scraper mirror relative to said mirror-remote guide element of said second linear guide along the second positioning axis into a target position; and a guide frame having four frame arms running perpendicular to each other, wherein:

two of said frame arms of said guide frame are frame arms of said first linear guide, and two further ones of said frame arms of said guide frame are frame arms of said second linear guide;

said frame arms of said first linear guide run along the first positioning axis, are spaced apart from each other along the second positioning axis, and each form a mirror-remote guide element of said first linear guide;

said frame arms of said second linear guide run along the second positioning axis, are spaced apart from each other along the first positioning, axis and each form a mirror-side guide element of said second linear guide;

on each of said frame arms of said first linear guide, said mirror-side guide element of said first linear guide assigned to a frame arm and connected to the scraper mirror is movably guided jointly with the scraper mirror along the first positioning axis;

each of said frame arms of said second linear guide is movably guided along the second positioning axis jointly with said first linear guide and the scraper mirror on an associated mirror-remote guide element of said second linear guide;

by means of said first positioning drive, the scraper mirror can be moved together with said mirror-side guide elements of said first linear guide relative to said frame arms of said first linear guide along the first positioning axis into the target position; and by means of said second positioning drive, said guide frame can be moved together with said mirror-side guide elements of said first linear guide and the scraper mirror along the second positioning axis into a target position.

2. The positioning device according to claim 1, wherein:
said first linear guide is a sliding guide;
at least one of said frame arms of said first linear guide is configured as a guiding frame arm by having two frame-side contact surfaces of said sliding guide which extend parallel to the positioning plane along the first positioning axis, and which are spaced apart from each other perpendicular to the positioning plane;
said mirror-side guide element of said first linear guide assigned to said guiding frame arm of said first linear guide lies opposite each of said frame-side contact surfaces perpendicular to the positioning plane with a mirror-side contact surface of said sliding guide which is assigned to a relevant frame-side contact surface of said sliding guide and which extends parallel to the positioning plane along the first positioning axis; and said frame-side and mirror-side contact surfaces of said sliding guide assigned to each other are in contact with each other.

3. The positioning device according to claim 2, wherein:
at least one of said frame-side contact surfaces extends as a flat surface along the first positioning axis, and an associated said mirror-side contact surface is in contact with said at least one frame-side contact surface at two points, which are offset from each other along the first positioning axis, and at which said associated mirror-side contact surface extends convexly relative to said at least one frame-side contact surface being a flat frame-side contact surface; and/or
at least one of said mirror-side contact surfaces extends as a flat surface along the first positioning axis, and an associated one of said frame-side contact surfaces is in contact with said mirror-side contact surface at two points, which are offset from each other along the first positioning axis, and at which said frame-side contact surface extends convexly relative to said mirror-side contact surface being a flat mirror-side contact surface.

4. The positioning device according to claim 2, wherein a three-point support of the scraper mirror in the positioning plane is formed on inner sides of said frame arms of said first linear guide, said inner sides of said frame arms of said first linear guide facing an interior of said guide frame, by a first frame-side support surface being provided on an inner side of a first frame arm of said frame arms of said first linear guide, which runs along the first positioning axis and extends perpendicular to the positioning plane,
by a first mirror-side support surface being provided on said mirror-side guide element of said first linear guide assigned to said first frame arm which runs along the first positioning axis and extends perpendicular to the positioning plane, and which lies opposite said first frame-side support surface in the positioning plane, and
by said first frame arm of said first linear guide and said mirror-side guide element of said first linear guide being supported on each other in the positioning plane with a first frame-side support surface and said first mirror-side support surface, wherein:
said first frame-side support surface is a flat first frame-side support surface that extends as a flat surface along the first positioning axis, and said first mirror-side support surface extends convexly relative to said flat first frame-side support surface at one point, and wherein said first frame arm of said first linear guide and said mirror-side guide element of said first linear guide are supported on each other in the positioning plane at a point at which said first mirror-side support surface extends convexly relative to said first frame-side support surface; or
said first mirror-side support surface is a flat first mirror-side support surface that extends as a flat surface along the first positioning axis, and said first frame-side support surface extends parallel to the positioning plane convexly relative to said flat first mirror-side support surface at a point, and wherein said first frame arm of said first linear guide and said mirror-side guide element of said first linear guide are supported on each other in the positioning plane at a point at which said first frame-side support surface extends convexly relative to said first mirror-side support surface; and
by, at a same time, a second frame-side support surface being provided on an inner side of a second frame arm of said frame arms of said first linear guide, which runs along the first positioning axis and extends perpendicular to the positioning plane, by a second mirror-side support surface being provided on said mirror-side guide element of said first linear guide assigned to the second frame arm which runs along the first positioning axis and extends perpendicular to the positioning plane, and which lies opposite said second frame-side support surface, and by said second frame arm of the first linear guide and said mirror-side guide element of said first linear guide being supported on each other in the positioning plane with said second frame-side support surface and said second mirror-side support surface, wherein:
said second frame-side support surface being a flat second frame-side support surface that extends as a flat surface along the first positioning axis, and said second mirror-side support surface extends convexly relative to said flat second frame-side support surface at two points offset from each other along the first positioning axis, and wherein said second frame arm of said first linear guide and said mirror-side guide element of said first linear guide are supported on each other in the positioning plane at the two points at which said second mirror-side support surface extends convexly relative to said second frame-side support surface; or
said second mirror-side support surface is a flat second mirror-side support surface that extends as a flat surface along the first positioning axis and said second frame-side support surface extends convexly relative to said flat second mirror-side surface at two points offset from each other along the first positioning axis, and wherein said second frame arm of said first linear guide and said mirror-side guide element of said first linear guide are supported on each other in the positioning plane at the two points at which said second frame-side support surface extends convexly relative to said second mirror-side support surface.

5. The positioning device according to claim 4, wherein:
said mirror-side guide element of said first linear guide is one of a plurality of mirror-side guide elements, at least one of said mirror-side guide elements is a guide shoe which has a U-shaped cross section in a sectional plane running perpendicular to the positioning plane;
said guide shoe has walls formed on arms of said U-shaped cross section, said walls include side walls which run along the first positioning axis;
said guide shoe has a base formed on a transverse web of said U-shaped cross section that connects said arms of said U-shaped cross section to each other, and runs along the first positioning axis; and
each of said side walls of said guide shoe, on a side which faces said guiding frame arm of said first linear guide, is provided with said mirror-side contact surface of said sliding guide; and/or
said base of said guide shoe is provided with said first mirror-side support surface on a side facing said inner side of said first frame arm of said first linear guide, or is provided with said second mirror-side support surface on a side facing the inner side of said second frame arm of said first linear guide.

6. The positioning device according to claim 1, wherein:
said first positioning drive is a first threaded positioning drive;
said first threaded positioning drive has an adjusting screw which has a screw bolt with an external thread, wherein a thread axis of said screw bolt runs along the first positioning axis;
said first threaded positioning drive further contains an internal thread which is provided on said guide frame and which is coaxial with said external thread on said screw bolt of said adjusting screw, and with which said external thread on said screw bolt of said adjusting screw meshes;
said screw bolt of said adjusting screw meshing with said internal thread on said guide frame can be moved along the first positioning axis by rotation about its thread axis relative to said guide frame; and
said screw bolt of said adjusting screw moved along the first positioning axis is movably connected to the scraper mirror in such a way that the scraper mirror can be moved in a guided manner along the first positioning axis into a target position, by rotating said screw bolt of said adjusting screw about its threaded axis, together with said mirror-side guide elements of said first linear guide and the scraper mirror relative to said frame arms of said first linear guide.

7. The positioning device according to claim 6, wherein said screw bolt has a preloaded spring element, said screw bolt of said adjusting screw is movably connected to the scraper mirror by the scraper mirror being supported by means of said preloaded spring element on said screw bolt of said adjusting screw along the first positioning axis.

8. The positioning device according to claim 1, further comprising a mirror holder, said scraper mirror is attached to said mirror holder, and said mirror-side guide element of said first linear guide is connected to the scraper mirror by means of said mirror holder.

9. The positioning device according to claim 1, wherein:
said second linear guide is a sliding guide;
at least one of said frame arms of said second linear guide is configured as a guided frame arm by having two frame-side contact surfaces of said sliding guide which extend parallel to the positioning plane along the second positioning axis, and which are spaced apart from each other perpendicular to the positioning plane;
said mirror-remote guide element of said second linear guide assigned to said guided frame arm of said second linear guide lies opposite each of said frame-side contact surfaces perpendicular to the positioning plane with a guide element-side contact surface of said sliding guide which is assigned to a frame-side contact surface of said sliding guide and which extends parallel to the positioning plane along the second positioning axis; and
said frame-side and guide element-side contact surfaces of said sliding guide that are assigned to each other are in contact with each other.

10. The positioning device according to claim 9, wherein:
at least one of said guide element-side contact surfaces is a flat guide element-side contact surface that extends as a flat surface along the second positioning axis, and an associated said frame-side contact surface is in contact with said guide element-side contact surface on at least one point at which said frame-side contact surface extends convexly relative to said flat guide element-side contact surface; and/or
at least one of the frame-side contact surfaces is a flat frame-side contact surface that extends as a flat surface along the second positioning axis, and an associated said guide element-side contact surface is in contact with said frame-side contact surface on at least one point at which said guide element-side contact surface extends convexly relative to said flat frame-side contact surface.

11. The positioning device according to claim 9, wherein said mirror-remote guide element of said second linear guide is one of a plurality of mirror-remote guide elements, a three-point support of said guide frame in the positioning plane is formed on mutually facing inner sides of said mirror-remote guide elements of said second linear guide,
by a first guide element-side support surface being provided on an inner side of a first of said mirror-remote guide elements of said second linear guide which runs along the second positioning axis and extends perpendicular to the positioning plane, by a first frame-side support surface being provided on said frame arm of said second linear guide assigned to said first mirror-remote guide element, which runs along the second positioning axis and extends perpendicular to the positioning plane and which lies opposite said first guide element-side support surface parallel to the positioning plane, and by said first mirror-remote guide element of said second linear guide and an associated said frame arm of said second linear guide being supported on each other in the positioning plane with said first guide element-side support surface and first frame-side support surface,
wherein said first guide element-side support surface is a flat first guide element-side support that extends as a flat surface along the second positioning axis, and said first frame-side support surface extends convexly relative to said flat first guide element-side support surface at a point, and wherein said first mirror-remote guide element of said second linear guide and the associated frame arm of said second linear guide are supported on each other in the positioning plane at the point at which said first frame-side support surface extends convexly relative to said first guide element-side support surface; or
wherein said first frame-side support surface is a flat first frame-side support surface that extends as a flat surface along the second positioning axis, and said first guide element-side support surface extends convexly relative to said flat first frame-side support surface at a point, and said first mirror-remote guide element of said second linear guide and an associated said frame arm of said second linear guide are supported on each other in the positioning plane at the point at which said first guide element-side support surface extends convexly relative to said first frame-side support surface; and
by, at a same time, a second guide element-side support surface being provided on said inner side of a second of said mirror-remote guide elements of said second linear guide, which runs along the second positioning axis and extends perpendicular to the positioning plane, by a second frame-side support surface being provided on said frame arm of said second linear guide assigned to said second mirror-remote guide element, which runs along the second positioning axis and extends perpendicular to the positioning plane, and which lies opposite said second guide element-side support surface parallel to the positioning plane, and by said second mirror-remote guide element of said second linear guide and an associated said frame arm of said second linear guide being supported on each other in the positioning plane with said second guide element-side support surface and said second frame-side support surface;
wherein said second guide element-side support surface is a flat second guide element-side support surface that extends as a flat surface along the second positioning axis, and said second frame-side support surface extends convexly relative to said flat second guide element-side support surface at two points offset from each other along the second positioning axis, and wherein said second mirror-remote guide element of said second linear guide and an associated said frame arm of said second linear guide are supported on each other in the positioning plane at the two points on which said second frame-side support surface extends convexly relative to said second guide element-side support surface; or
wherein said second frame-side support surface is a flat second frame-side support surface that extends as a flat surface along the second positioning axis, and said second guide element-side support surface extends convexly relative to said flat second frame-side support surface at two points offset from each other along the second positioning axis, and wherein said second mirror-remote guide element of said second linear guide and an associated said frame arm of said second linear guide are supported on each other in the positioning plane at the two points at which said second guide element-side support surface extends convexly relative to said second frame-side support surface.

12. The positioning device according to claim 9, further comprising an outer guide frame;
wherein said guide frame with said frame arms of said first linear guide and said frame arms of said second linear guide is provided as an inner guide frame and is disposed within said outer guide frame;
wherein said outer guide frame has four frame arms running perpendicular to each other;
wherein two of said frame arms of said outer guide frame are provided as guiding frame arms, extend along the second positioning axis, are spaced apart from each other along the first positioning axis, and form said mirror-remote guide elements of said second linear guide; and
wherein two further one of said frame arms of said outer guide frame are provided as frame arms connecting said guiding frame arms to each other, extend along the first positioning axis, and are spaced apart from each other along the second positioning axis to a greater extent than a length of said inner guide frame along the second positioning axis.

13. The positioning device according to claim 12, wherein said outer guide frame is divided parallel to the positioning plane to form two outer frame parts connected to each other.

14. The positioning device according to claim 12, wherein:
said second positioning drive is a second threaded positioning drive;
said second threaded positioning drive contains an adjusting screw having a screw bolt with an external thread, wherein a threaded axis of said screw bolt runs along the second positioning axis;
said second threaded positioning drive further contains an internal thread which is provided on said outer guide frame and is coaxial with said external thread on said screw bolt of said adjusting screw, and with which said external thread on said screw bolt of said adjusting screw meshes;

said screw bolt of said adjusting screw, which meshes with said internal thread on said outer guide frame, can be moved relative to said outer guide frame along the second positioning axis by rotating about its thread axis; and said screw bolt of said adjusting screw moved along the second positioning axis is movably connected to said inner guide frame in such a way that said inner guide frame can be moved in a guided manner along the second positioning axis into a target position, by rotating said screw bolt of said adjusting screw about its thread axis, together with said mirror-side guide elements of said first linear guide and the scraper mirror.

15. A beam guide for guiding a laser beam on a device for extreme ultraviolet (EUV) lithography, the beam guide comprising:

a scraper mirror for coupling out laser radiation;

a positioning device for positioning said scraper mirror in a positioning plane defined by a first positioning axis and a second positioning axis, the first positioning axis and the second positioning axis running perpendicular to each other;

said positioning device containing two positioning units including a first positioning unit assigned to the first positioning axis and a second positioning unit assigned to the second positioning axis;

said first positioning unit having a first linear guide and a first positioning drive, said first linear guide having a mirror-side guide element and a mirror-remote guide element, said mirror-side guide element of said first linear guide being connected to said scraper mirror and jointly guided with said scraper mirror on said mirror-remote guide element of said first linear guide along the first positioning axis, wherein by means of said first positioning drive, said scraper mirror being moved together with said mirror-side guide element of said first linear guide relative to said mirror-remote guide element of said first linear guide along the first positioning axis into a target position;

said second positioning unit having a second linear guide and a second positioning drive, said second linear guide having a mirror-side guide element and a mirror-remote guide element;

said mirror-side guide element of said second linear guide being connected to said mirror-remote guide element of said first linear guide, and being movably guided along the second positioning axis jointly with said first linear guide and said scraper mirror on said mirror-remote guide element of said second linear guide, and wherein by means of said second positioning drive, said first linear guide being moved together with said mirror-side guide element of said second linear guide and said scraper mirror relative to said mirror-remote guide element of said second linear guide along the second positioning axis into a target position; and a guide frame having four frame arms running perpendicular to each other, wherein:

two of said frame arms of said guide frame are frame arms of said first linear guide, and two further ones of said frame arms of said guide frame are frame arms of said second linear guide;

said frame arms of said first linear guide run along the first positioning axis, are spaced apart from each other along the second positioning axis, and each form a mirror-remote guide element of said first linear guide;

said frame arms of said second linear guide run along the second positioning axis, are spaced apart from each other along the first positioning, axis and each form a mirror-side guide element of said second linear guide;

on each of said frame arms of said first linear guide, said mirror-side guide element of said first linear guide assigned to a frame arm and connected to said scraper mirror is movably guided jointly with said scraper mirror along the first positioning axis;

each of said frame arms of said second linear guide is movably guided along the second positioning axis jointly with said first linear guide and said scraper mirror on an associated mirror-remote guide element of said second linear guide;

by means of said first positioning drive, said scraper mirror being moved together with said mirror-side guide elements of said first linear guide relative to said frame arms of said first linear guide along the first positioning axis into the target position; and by means of said second positioning drive, said guide frame can be moved together with said mirror-side guide elements of said first linear guide and said scraper mirror along the second positioning axis into a target position.

* * * * *